(12) United States Patent
Lee

(10) Patent No.: US 10,928,054 B2
(45) Date of Patent: Feb. 23, 2021

(54) SENSOR SYSTEM AND APPARATUS

(71) Applicant: TITIAN TECH INC., Taichung (TW)

(72) Inventor: Eric Chao-Lung Lee, Taichung (TW)

(73) Assignee: TITIAN TECH INC., Taichung (TW)

( * ) Notice: Subject to any disclaimer, the term of this patent is extended or adjusted under 35 U.S.C. 154(b) by 0 days.

(21) Appl. No.: 16/632,384

(22) PCT Filed: Jul. 26, 2018

(86) PCT No.: PCT/EP2018/070345
§ 371 (c)(1),
(2) Date: Jan. 20, 2020

(87) PCT Pub. No.: WO2019/034389
PCT Pub. Date: Feb. 21, 2019

(65) Prior Publication Data
US 2020/0158319 A1 May 21, 2020

(30) Foreign Application Priority Data
Jul. 28, 2017 (LU) ........................................ 100351

(51) Int. Cl.
*G06F 3/00* (2006.01)
*F21V 23/04* (2006.01)
(Continued)

(52) U.S. Cl.
CPC ....... *F21V 23/0485* (2013.01); *H03K 17/962* (2013.01); *H05B 45/10* (2020.01);
(Continued)

(58) Field of Classification Search
CPC ....... G06F 3/041; G06F 3/044; G02F 1/13338
See application file for complete search history.

(56) References Cited

U.S. PATENT DOCUMENTS

| 10,139,931 B2* | 11/2018 | Kobayashi | G06F 3/0362 |
| 2012/0212433 A1* | 8/2012 | Lee | G06F 1/1652 |
| | | | 345/173 |

(Continued)

FOREIGN PATENT DOCUMENTS

| CN | 106545896 A | 3/2017 |
| CN | 206272594 U | 6/2017 |

(Continued)

*Primary Examiner* — Thuy Vinh Tran
(74) *Attorney, Agent, or Firm* — Winston Hsu

(57) ABSTRACT

A sensor apparatus and method of installation, and a system for controlling at least one electrical device and a method of use of such system. The apparatus comprises a mount adapted to be attached to a support and a sensor element adapted to be detachably connected to the mount. The method of installing a sensor apparatus comprises providing a sensor apparatus according to the first aspect of the present invention. The method further comprises the steps of retainably affixing the mount to, or within, the support and detachably connecting the sensor element to the mount. The system for controlling at least one electrical device comprises at least one sensor apparatus, at least one electrical device, and a controller, wherein the at least one sensor apparatus and the at least one electrical device are electrically connected to the controller.

20 Claims, 13 Drawing Sheets

(51) Int. Cl.
  *H05B 45/10*   (2020.01)
  *H05B 47/105*  (2020.01)
  *H03K 17/96*   (2006.01)
  *F21Y 115/10*     (2016.01)
  *G06F 3/041*      (2006.01)
  *G02F 1/1333*     (2006.01)
  *G06F 3/044*      (2006.01)

(52) U.S. Cl.
  CPC ........ *H05B 47/105* (2020.01); *F21Y 2115/10* (2016.08); *G02F 1/13338* (2013.01); *G06F 3/041* (2013.01); *G06F 3/044* (2013.01); *H03K 2217/960735* (2013.01); *H03K 2217/960755* (2013.01)

(56)  References Cited

U.S. PATENT DOCUMENTS

| | | | |
|---|---|---|---|
| 2017/0089496 A1* | 3/2017 | Lennon | F16L 13/146 |
| 2018/0024648 A1* | 1/2018 | Watanabe | G06F 3/0414 |
| | | | 345/174 |

FOREIGN PATENT DOCUMENTS

| | | |
|---|---|---|
| EP | 2728972 A1 | 5/2014 |
| JP | 2017-21919 A | 1/2017 |
| TW | 201302029 A1 | 1/2013 |
| TW | 201308046 A1 | 2/2013 |
| TW | 201705997 A | 2/2017 |
| WO | 2012/137046 A1 | 10/2012 |

* cited by examiner

SENSOR SYSTEM AND APPARATUS

FIELD OF INVENTION

The present invention relates to a sensor apparatus and control system for controlling at least one electrical device, such as light(s).

BACKGROUND OF INVENTION

It is known to use switches, such as mechanical rocker switches, to switch or control power supplies to electrical devices, particularly in a domestic environment. For example, wall mounted rotary switches or rocker switches are commonly used to switch on/off, or control dimming of lights.

Such switches control the power supply to appliances. The power supply, particularly in a domestic environment, may be a high voltage, high current supply, such as an AC 240V, 50 Hz supply. The installation of such switches may be regulated for reasons of public safety. Further, the positioning of such switches, in particular relative to other electrical equipment, may also be regulated.

Typically, switches intended for indoor use may not be readily used in wet or outdoor environments.

Further, such switches are normally limited to installation on flat surfaces with adequate access space, and limited obstructions in the vicinity of the switch.

Such switches can be difficult to install, and may require templating and cutting of holes in a support surface.

It is an object of at least one embodiment of at least one aspect of the present invention to seek to address one or more problems and/or disadvantages in the prior art.

SUMMARY OF INVENTION

According to a first aspect of the present invention there is provided a sensor apparatus, the apparatus comprising a mount adapted to be attached to a support, and a sensor element adapted to be detachably connected to the mount.

The apparatus may be capable of and/or may be arranged to act as a switch, e.g. as a touch switch. For example, the apparatus may be capable of and/or may be arranged to actuate an electrical switch and/or controller, such as a switch or controller to a lighting device, as described in more detail below.

The mount may be adapted to be retainably affixed to, or within, the support. The mount may be adapted to retainably contact and/or engage the support.

The support may be or may comprise a structure such as a wall, a ceiling, a floor, a door, e.g., a surface thereof.

The mount may be adapted to be located within a hole, gap or void in the support. Advantageously, such an arrangement may permit the sensor element to be substantially flush with the support, e.g. with a/the surface thereof, as will be described further below.

The mount, or a body of the mount, may be substantially cylindrical, e.g. around an axis thereof. The mount may be adapted to be affixed to, or within, the support, wherein the axis is substantially perpendicular to the support, e.g. to a surface thereof. The mount may have a diameter of approximately 20 millimetres. The mount may have a diameter in the range of 18 to 22 millimetres. The mount may have a diameter in the range of 15 to 25 millimetres. Advantageously, such an arrangement may provide for straightforward installation of the apparatus, requiring minimal labour. For example, a hole may be drilled using a conventional drill. In contrast, installation of a conventional oblong or rectangular mount may require templating and cutting. Further, a circular hole requires no particular orientation, whereas cutting of a non-circular hole may require precise orientation, through use of a sprit level of the like.

The mount may comprise a first connecting element.

The first connecting element may comprise a compressible and/or expandable body.

The first connecting element may be adapted to form a seal with the support, such as with an edge of the support.

The first connecting element may be a sealing element. The sealing element may be capable of, or adapted to, create a seal, such as a waterproof seal. Advantageously, the provision of a sealing element may prevent water ingress. Advantageously, such a sealing element permits installation of the apparatus in an environment where the apparatus may be subject to water or moisture, such as an outdoor environment. Such a sealing element may also ensure a tight fit to minimise movement of the apparatus in use. Further, the provision of a sealing element simplifies installation, and allows the mount to be accommodated in various shapes and sizes of hole, gap or void in the support. Further, the sealing element allows flush mounting of the apparatus to the support, even when a hole in which the apparatus is to be mounted has been drilled off-camber. Thus, the provision of a sealing element simplifies installation, since it permits a degree of variance in the size and shape of the hole in which the mount is installed.

The mount may comprise a second connecting element. The second connecting element may comprise a compressible and/or expandable body. The second connecting element may be adapted to sealingly engage with or sealingly contact the sensor element. The second connecting element may be a sealing element. Similarly, such a sealing element may also ensure a tight fit to minimise movement of the sensor element in use.

The sensor apparatus may be waterproof. The sensor apparatus may be water resistant. The sensor apparatus may be adapted for usage in environments whereby the sensor apparatus may be subject to water or moisture, such as outdoors, in or in the vicinity of domestic plumbing such as showers, toilets or taps, or in the vicinity of swimming pools, water features, or the like.

The first and/or second connecting elements may comprise a flexible and/or elastic or elastomeric material. The first and/or second connecting elements may comprise a polymeric material such as rubber, silicone, or the like. The first and/or second connecting elements may comprise O-rings.

The first and/or second connecting elements may comprise a non-conductive material. Advantageously, a non-conductive material may insulate a sensor probe from electrical interference.

The mount may comprise a mount plate. The mount plate may comprise an electrically conductive surface. The mount plate may be electrically conductive. The mount plate may comprise an aluminium alloy material for basic resistance to corrosion. The mount plate may comprise stainless steel for resistance to corrosion. The mount plate may be substantially circular when viewed along the axis. The mount plate may be substantially disc-shaped or wheel-shaped.

The mount plate may comprise a circumferentially arranged flange or shoulder. The first and/or second connecting elements may be arranged on, or abutting, or adjacent, such as immediately adjacent, the mount plate. The first and/or second connecting elements may be arranged around the mount plate. The first connecting element may be arranged on, or abutting, or adjacent, a first side of the mount plate. The second connecting element may be arranged on, or abutting, or adjacent, a second side of the mount plate. The first and/or second connecting elements may be arranged on, or abutting, or adjacent, such as immediately adjacent, the flange or shoulder. The first connecting element may be arranged on, or abutting, or adjacent, a first side of the flange or shoulder. The second connecting element may be arranged on, or abutting, or adjacent, a second side of the flange or shoulder. The first and/or second connecting element may be affixed, such as retainably or releasably affixed to the mount plate by a push fit, or pressure fit connection, or the like.

The mount plate may comprise at least one indentation, groove, hole or slot, or the like. The mount plate may comprise a plurality of indentations, grooves, holes or slots arranged around the axis. The plurality of indentations, grooves, holes or slots may be radially arranged around the axis. The plurality of indentations, grooves, holes or slots may be circumferentially arranged around the axis. Advantageously, the provision of slots or holes may allow light, such as light from an indicator LED or other illuminating device or indicator device, located within a portion or section of the mount, to pass through the mount plate. Further, such light may be diffused by the sealing element. Advantageously, the provision of grooves, holes or slots arranged around the axis may provide a surface, edge or feature that may be gripped or attached to a tool during installation of the apparatus. The grooves, holes or slots may be gripped during installation to prevent rotation of the mount, of a portion of the mount, within the hole, gap or void in the support. Advantageously, the grooves, holes or slots may comprise a portion, such as a complementary portion, of a snap-fit connection, a push-fit connection, or a tension-setting connection of the sensor element.

The mount plate may comprise a further hole. The further hole may be located substantially in a centre of the mount plate. The hole may extend from a front face of the mount plate to a rear face of the mount plate. The further hole may be provided to receive a connecting element, such as a bolt, screw, or the like. The further hole may permit the mount plate to be connected to an end portion, as will be described below.

The front face of the mount plate may comprise a raised portion. The raised portion may be arranged around the further hole. The raised portion may comprise at least one substantially flat edge. The raised portion may comprise a polygon. The raised portion may comprise a substantially hexagonal shape. The raised portion may advantageously be arranged or configured to be gripped or retained by a tool, such as a spanner, a wrench or the like.

The mount may comprise an end-portion. The mount may comprise the end-portion at, or near a location distal or opposite from a portion of the mount adapted for receiving or connection with the sensor element. The end portion may be substantially cylindrical. The end portion may comprise a threaded portion. The end portion may be adapted to receive a connecting element, such as a bolt, screw, or the like. The end portion may comprise a plastic material. The end portion may comprise a non-conductive material. The end portion may comprise a conducting material, such as metal, or the like.

The mount may comprise the bolt, a screw, or the like adapted to connect to the end portion. The connecting element may comprise a conductive material, such as a metal or metal-alloy. The connecting element, may comprise stainless steel.

The mount may comprise at least one intermediate portion provided and/or extending between the end portion and the mount plate. The at least one intermediate portion may be substantially cylindrical. The at least one intermediate portion may be adapted to receive the connecting element. The intermediate portion may be translucent or transparent. The intermediate portion may be adapted to diffuse or propagate light from an indicator device, as described in more detail below. The intermediate portion may comprise a plastic material. The intermediate portion may comprise a non-conductive material. The intermediate portion may comprise a conducting material, such as metal, or the like.

The mount may be adapted such that the connecting element, connects the mount plate to the end portion. The mount may be adapted such that the connecting element, mates with the end portion. The mount may be adapted such that the connecting element, is adapted to rotate freely in the further hole of the mount plate.

The mount may be adapted such that rotation of the connecting element in a first direction, moves, winds or pulls the end portion towards the mount plate. The mount may be adapted such that movement of the end portion towards the mount plate causes a compressive force to be applied to the first element in a direction parallel to the axis, e.g. longitudinal axis of the mount. The mount may be adapted such that movement of the end portion towards the mount plate causes compression of the first element between the mount plate and the end portion and/or the at least one intermediate portion. The first connecting element may be adapted such that movement of the end portion towards the mount plate causes compression of the first element between the mount plate and the end portion or the at least one intermediate portion. The connecting element, may be adapted to be rotated by an Allen key, a screwdriver, or the like, wherein rotation in the first direction causes the end portion to move towards the mount plate.

The first connecting element may be adapted such that compression of the first connecting element in an axial direction cause expansion of the first connecting element in a radial direction. The first connecting element may be adapted such that compression of the first connecting element in a direction along the axis e.g. the longitudinal axis of the mount, cause expansion of the first connecting element in a direction radial relative to the axis. The mount may be retained in the hole, gap or void in the support by the first connecting element. In use, the mount may be located in the hole, gap or void in the support and the connecting element rotated until the expansion of the first connecting element in a direction radial to the axis forms a seal with the support, such as with an edge of the support.

The end portion and/or the at least one intermediate portion may comprise an electrical contact. The connecting element may provide electrical connectivity between the mount plate and the electrical contact. The connecting element may comprise at least a portion of the sensor probe.

The sensor element may comprise at least a portion of the sensor probe. The connecting element may be, or may comprise, at least a portion of a sensor probe.

The end portion and/or the at least one intermediate portion may comprise a sensor circuit. The electrical contact may be electrically connected to, of form part of, the sensor circuit.

The sensor circuit may comprise at least one touch sense controller or the like. The sensor circuit may be adapted to detect and/or measure relative changes and/or durations of electro-static charges. The sensor circuit may be adapted to detect and/or measure relative changes and/or durations of electro-static charges, such as electro-static charges present at a sensor probe and/or the sensor element. The sensor circuit may be adapted to convert relative changes and/or durations of electro-static charges into one or more signals. The sensor circuit may be adapted to represent relative changes and/or durations of electro-static charges as one or more signals. The sensor circuit may be adapted to categorize signals into long and short signals. Short signals may be used, for example, to turn on or off a switch, such as a switch to a lighting device, as described in more detail below. Long signals may be used, for example, to control a device, such as to control dimming of a lighting device, as described in more detail below. Short and/or long signals may be used, for example, to control a device, such as to control a speed or direction or duration of actuation of a motor.

The sensor circuit may comprise at least one indicator device. The at least one indicator device may comprise at least one of: an LED; a bulb; a sound-generating device; a motor; or an actuator. The at least one indicator device may provide an indication, i.e. illuminate the LED or generate a sound, when the sensor circuit is in use. That is, the at least one indicator device may provide an indication when a relative change in electro-static charge is detected and/or for the duration of that change.

The sensor circuitry may comprise at least one touch sense integrated controller. The sensor circuitry may be adapted for capacitive touch sensing. The sensor circuitry may be adapted for inductive touch sensing. The sensor circuit may comprise the electrical contact and/or the sensor probe.

The sensor circuit may be adapted to configure, adapt and/or communicate with at least one controller. The at least one controller may be adapted to configure, adapt and/or communicate with at least one electrical device. The sensor circuit may be adapted to directly, or indirectly, configure, adapt and/or communicate with the at least one electrical device.

The sensor circuit may operate at a low voltage relative to a voltage of the at least one electrical device. At least a portion of the sensor circuit may operate at a DC voltage. The DC voltage may be around 5V, 3.3V, 1.8V, or the like.

The sensor element may be provided in a variety of shapes, sizes, colours and patterns, such a substantially square, circular, rectangular, triangular, oval-shaped, curved, concave, convex, or the like. Advantageously, a sensor element may be or may have a shape adapted to fit in or around an obstruction on the support, such as a corner, a structural feature, another appliance or switch, or the like.

The sensor element may comprise a non-conductive material, such as a plastic, a polymeric material, or the like. An outer surface of the sensor element may be non-conductive.

The sensor element may comprise a conductive material. The sensor element may comprise a metal or metal alloy. The sensor element may comprise a conductive plate or element. At least one surface of the sensor element, such as an inner or outer surface, may be conductive.

The sensor element may comprise a sensor probe for a capacitive touch sensor. The sensor element may comprise a sensor probe for an inductive touch sensor. The sensor element may comprise a sensor probe for a resistive touch sensor. Thus, the sensor element may be configured to react to contact, e.g. touch, by a user, and may be termed a "touch plate".

The sensor element may comprise a recess, e.g. a substantially circular or cylindrical recess. The recess may be adapted to sealingly engage with the second connecting element. The sensor element may be releasably connected to the mount by a push fit, or pressure fit connection, or the like.

The sensor element may be adapted such that, when the recess is sealingly engaged with the second connecting element, a portion of the sensor element may be directly or indirectly in contact with the mount plate and/or the connecting element.

The sensor element may be adapted such that, when the recess is sealingly engaged with the second connecting element, the conductive plate or element may be directly or indirectly in contact with the mount plate and/or the connecting element.

The sensor element may be adapted such that, when the recess is sealingly engaged with the second connecting element, a portion of the sensor element may be directly or indirectly in contact, such as directly or indirectly in conductive contact, with the support.

According to a second aspect of the present invention there is provided a method of installing a sensor apparatus, comprising: providing a sensor apparatus according to the first aspect of the present invention,
  retainably affixing the mount to, or within, the support and
  detachably connecting the sensor element to the mount.

The method may comprise a step of drilling or cutting a hole in the support. The hole may have a diameter of approximately 20 millimetres. The hole may have a diameter in the range of 18 to 22 millimetres. The hole may have a diameter in the range of 15 to 25 millimetres. The hole may be substantially circular.

The method may comprise the step of locating the mount within the hole in the support.

The method may comprise the step of rotating a connecting element, such as a bolt, screw, or the like in the mount until a radial expansion of a first connecting element forms a seal with the support.

The method may comprise the step of gripping or restraining a mount plate during rotation of the connecting element in the mount, such that the connecting element rotates relative to the mount plate.

The step of releasably connecting the sensor element to the mount may comprise applying a pushing force to the sensor element, the force acting to push the sensor element against and/or onto the mount.

According to a third aspect of the present invention there is provided a system for controlling at least one electrical device, the system comprising at least one sensor apparatus according to the first aspect; at least one electrical device; and a controller; wherein the at least one sensor apparatus and the at least one electrical device are electrically connected to the controller.

The at least one sensor apparatus may be adapted to receive a low voltage supply and the at least one electrical device may be adapted to receive a high voltage supply.

The at least one electrical device may comprise at least one light source, such as an LED, an incandescent bulb, a phosphorescent bulb, a fluorescent bulb, or the like. The at least one electrical device may comprise a motor. The at least one electrical device may comprise a fan, a winding device for curtains or blinds, a door opening/closing mechanism, or the like.

The at least one electrical device may comprise driver circuitry, wherein the driver circuitry may comprise a TRIAC LED driver, or the like.

The at least one electrical device may be adapted to be supplied by a high voltage power supply relative to a voltage of a power supply to the sensor circuit. The electrical device may be supplied by a DC supply. The electrical device may be supplied by an AC supply. The AC supply may have a frequency of substantially in the range of 50 to 60 Hz. The high voltage power supply relative to a voltage of a power supply to the sensor circuit. The high voltage power supply may be substantially in the range of 100 to 120V or 220 to 240V.

The at least one electrical device, e.g. the light source, may be adapted to be actuated, e.g. switched on, switched off and/or dimmed, by the controller.

Thus, the apparatus may operate as a light switch and/or a light dimmer switch/controller.

The controller may be adapted to receive the high voltage power supply. The controller may provide, or control, a high voltage power supply to the at least one electrical device. The controller may be adapted to provide a low voltage power supply to the sensor circuit. The controller may comprise a transformer adapted to provide a low voltage power supply to the sensor circuit. The controller may be adapted to configure, adapt and/or communicate with at least one electrical device. The controller may be adapted to communicate with and/or receive a signal from at least one sensor apparatus. The controller may be adapted to configure, adapt and/or communicate with at least one electrical device based on a signal received from at least one sensor apparatus. The controller may be adapted to communicate with and/or receive a signal from a plurality of sensor apparatuses.

The controller may be adapted to provide, or moderate, modulate or control, a high voltage power supply, such as the high voltage power supply, to the at least one electrical device. The controller may be, may comprise, or may be adapted to provide, a control signal, such as a control signal suitable for controlling a TRIAC driver or a 0-10V light-dimming controller or a 1-10V light-dimming controller.

The controller may comprise an integrated controller. The controller may comprise a memory. The controller may store information relating to at least one sensor apparatus in the memory. The information relating to at least one sensor apparatus may comprise at least one of: historical information relating to previous usage or settings of the at least one sensor apparatus and/or the at least one light source; current information relating to previous usage or settings of the at least one sensor apparatus and/or the at least one light source; and/or calibration data relating to previous usage or settings of the at least one sensor apparatus and/or the at least one light source.

The controller may be adapted to use the information relating to at least one sensor apparatus to determine how to configure and/or adapt and/or what to communicate with at least one electrical device.

The controller may be adapted to use the information relating to at least one sensor apparatus to determine how to configure and/or adapt and/or what to communicate with at least one electrical device based on a signal received from at least one sensor apparatus.

The controller may be adapted to control dimming of the at least one light source based on signals received from any one or more of a plurality of sensor apparatuses.

In use, the controller may be located in the proximity of, such as directly beside or behind, one of the at least one sensor apparatuses. In use, the controller may be located approximately 0.5 metres or less from the at least one sensor apparatus. In use, the controller may be located approximately 1 metre or less from the at least one sensor apparatus.

In use, the controller may be located in the proximity of, such as directly beside, one of the at least one electrical devices. In use, the controller may be located approximately 0.5 metres or less from one of the at least one electrical device. In use, the controller may be located approximately 1 metre or less from one of the at least one electrical device.

In use, the controller may be located remotely from the at least one sensor apparatus and/or the at least one electrical device.

Advantageously, by locating the controller, which may comprise high voltage electrical circuitry that is subject to regulatory control of placement, at a location distinct from the location of the sensor apparatus, the sensor apparatus may avoid regulatory control of placement. That is, due to the low-voltage associated with the sensor apparatus, the sensor apparatus may be placed in environments normally not suitable for regulated and/or high voltage, electrical or electronic components.

Advantageously, by locating the controller at a location distinct from the location of the sensor apparatus, the sensor (i.e. the mount plate, and/or connecting element) may be located a short distance from the sensor element. The short distance may serve to reduce electrical impedance and/or interference.

According to a fourth aspect of the present invention there is provided a method for controlling and/or actuating at least one electrical device, wherein the method comprises providing a system according to the third aspect of the present invention, and touching a sensor element to actuate and/or control the at least one electrical device.

The system may comprise a plurality of sensor apparatuses according to the first aspect. Each sensor apparatus of the plurality of sensor apparatuses may be adapted to control and/or actuate the same electrical device(s). Advantageously, such an arrangement permits, for example, a lighting control system wherein the light may be actuated of controlled from sensor apparatuses located at different positions within a building.

The method, wherein actuation of the at least one electrical device may comprise switching on or switching off the at least one electrical device.

The method, wherein actuation of the at least one electrical device may comprise adjusting or configuring, e.g. adjusting a power supply to, the at least one electrical device.

The method may further comprise the step of touching the sensor element for a first duration, wherein a first duration of touching the sensor element may be in the region of 1 second, or less.

The method may further comprise the step of touching the sensor element for a second duration, wherein a second duration of touching the sensor element may be in the region of 1 second or more.

The method wherein touching the sensor element for a first duration actuates the at least one electrical device.

The method wherein touching the sensor element for a second duration actuates the at least one electrical device.

The method wherein a degree of actuation of the at least one electrical device is related, such as proportionally related, to the first and/or second duration of touching the sensor element.

The method wherein an actuation, or a degree of actuation of the at least one electrical device is related to a quantity and/or duration and/or sequence of touches of the sensor element.

It should be understood that the features defined above in accordance with any aspect of the present invention or below relating to any specific embodiment of the invention may be utilised, either alone or in combination with any other defined feature, in any other aspect or embodiment or to form a further aspect or embodiment of the invention.

Furthermore, the present invention is intended to cover apparatus configured to perform any feature described herein in relation to a method and/or a method of using or producing, using or manufacturing any apparatus feature described herein.

BRIEF DESCRIPTION OF DRAWINGS

These and other aspects will now be described, by way of example only, with reference to the accompanying drawings, which show:

FIG. 1b an isometric view of the assembled mount of FIG. 1a;

FIG. 6b a further representation of the sensor element of FIG. 6a;

FIG. 7b a further representation of the sensor element of FIG. 7a;

DETAILED DESCRIPTION OF DRAWINGS

Figure 1A:
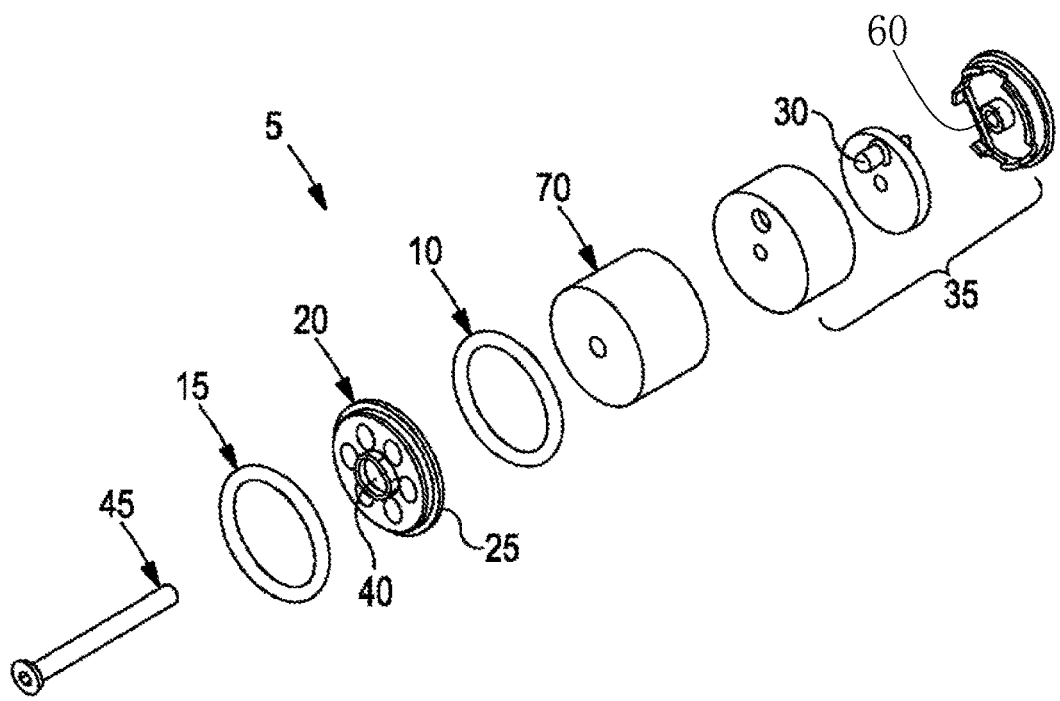
FIG. 1a an isometric, exploded view of a mount according to a first embodiment of the invention.
Figure 1B:
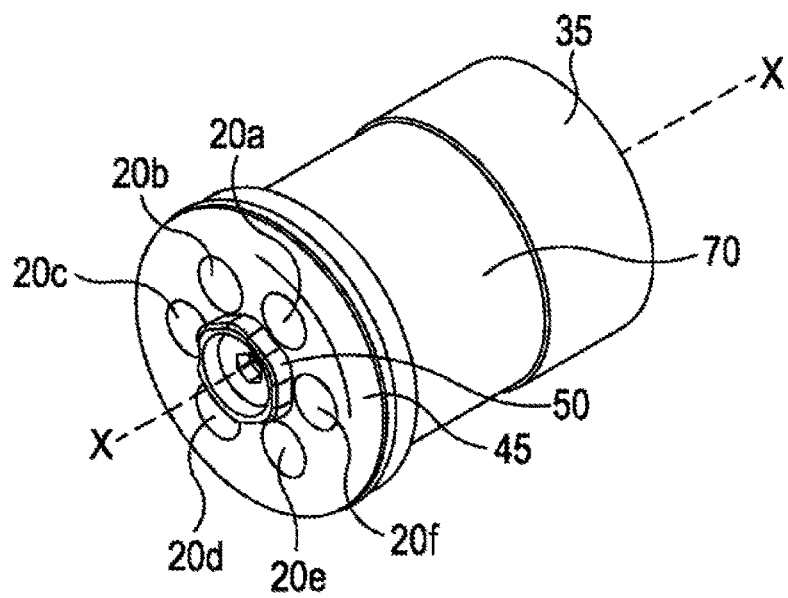

Referring firstly to FIGS. 1a and 1b of the accompanying drawings, there is shown a mount for a sensor apparatus, generally denoted 5. The mount 5 is adapted to be retainably affixed to, or within, a support (not shown). The support may be or may comprise a structure such as a wall, a ceiling, a floor, a door, e.g., a surface thereof.

The mount 5 is substantially cylindrical, e.g. around an axis X thereof.

The mount 5 comprises a first connecting element 10. The first connecting element 10 comprises a compressible body. The first connecting element 10 is adapted to form a seal with the support (not shown).

The first connecting element 10 is a sealing element.

The mount 5 comprises a second connecting element 15. The second connecting element 15 comprises a compressible body. The second connecting element 15 is adapted to sealingly engage with the sensor element 120, 140 (FIGS. 6a, 6b, 7a and 7b). The second connecting element 15 is a sealing element. The first connecting element 10 and the second connecting element 15 comprise a flexible material. The first connecting element 10 and the second connecting element 15 are O-rings. The first connecting element 10 and the second connecting element 15 comprise a non-conductive material.

The mount 5 comprises a mount plate 20. The mount plate 20 is electrically conductive. One would appreciate that in embodiments encompassing the inventive concept of the present invention, the mount plate 20 may comprise an aluminium alloy or stainless steel for resistance to corrosion.

The mount plate 20 is substantially circular when viewed along axis X. The mount plate 1 is substantially disc-shaped.

The mount plate 20 comprises a circumferentially arranged flange 25. As shown in FIG. 1b, and more clearly in FIG. 2, the first connecting element 10 and the second connecting element 15 are arranged on the mount plate 20. The first connecting element 10 and the second connecting element 15 are arranged around the mount plate 20. The first connecting element 10 is arranged on a first side of the mount plate 20 and the second connecting element 15 is arranged on a second side of the mount plate 20. The first connecting element 10 and the second connecting element 15 are arranged on the flange 25. The first connecting element 10 is arranged on a first side of the flange 25. The second connecting element 15 is arranged on a second side of the flange 25. The first connecting element 10 and the second connecting element 15 are affixed to the mount plate 20 by a push fit/interference connection, e.g. by being stretched over a portion of the mount 5 or mount plate 20 near or adjacent the flange 25. One would appreciate that in other embodiments of the present invention, first connecting element 10 and the second connecting element 15 may be affixed to the mount plate 20 by other means, such as adhesive, or the like.

The provision of the holes 20a, 20b, 20c, 20d, 20e, 20f permits light from an indicator LED 30 located within an end portion 35 of the mount 5, to pass through the mount plate 20. Further, the light may be diffused by an intermediate portion 70.

The mount plate 20 comprises a further hole 40. The further hole 40 is located substantially in a centre of the mount plate 20. The hole 40 extends from a front face of the mount plate 20 to a rear face of the mount plate 20. The further hole 40 is provided to receive a screw 45. The further hole 40 permits the mount plate 20 to be connected to an end portion 35, as will be described below.

Figure 3:
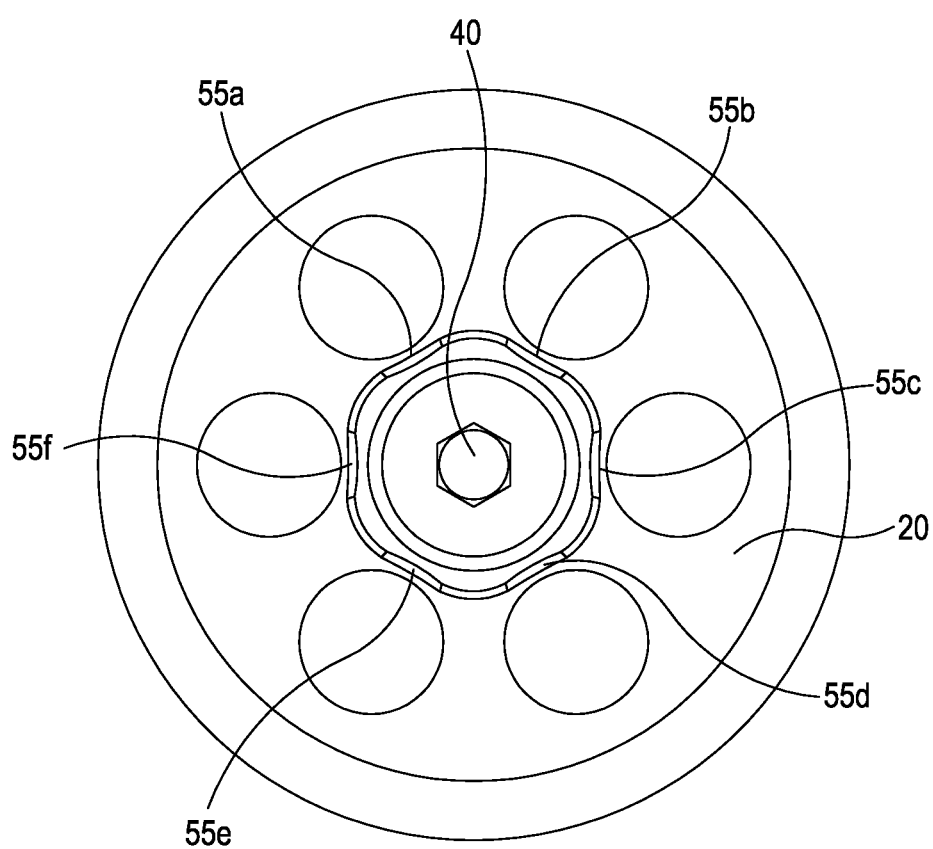
FIG. 3 a front view of the mount of FIG. 1b.

The front face of the mount plate 20 comprises a raised portion 50. The raised portion is arranged around the further hole 40. The raised portion 50 comprises a plurality of substantially flat edges 55a, 55b, 55c, 55d, 55e, 55f (FIG. 3). The raised portion 50 comprises a polygon. In the exemplary embodiment shown, the raised portion 50 comprises a substantially hexagonal shape. One would appreciate that in other embodiments encompassing the inventive concept of the present invention, the raised portion 50 may comprise any other shape that is adapted to be gripped or retained by a tool, such as a spanner, a wrench or the like.

The mount 5 may comprise an end-portion 35. The mount 5 comprises the end-portion 35 at, or near a location distal or opposite from a portion of the mount adapted for receiving or connection with the sensor element 120, 140. The end portion 35 is substantially cylindrical. The end portion 35 comprises a threaded portion 60. The end portion 35 is adapted to receive the screw 45.

The mount 5 comprises the screw 45 adapted to connect to the end portion 35. One would appreciate that in other embodiments encompassing the inventive concept of the present invention, the screw 45 may instead be a bolt, or the like. The screw 45 comprises a conductive material, such as a metal or metal-alloy.

The mount 5 comprises the intermediate portion 70 between the end portion 35 and the mount plate 20. The intermediate portion 70 is substantially cylindrical. The intermediate portion 70 is adapted to receive the screw 45. One would appreciate that in other embodiments encompassing the inventive concept of the present invention, there may be no intermediate portion and the end portion 35 may abut the first connecting element 10 directly. Further, in embodiments encompassing the inventive concept of the present invention, the intermediate portion 70 may be translucent or transparent, such that the intermediate portion 70 is adapted to diffuse or propagate light from the indicator device 30.

The mount 5 is adapted such that the screw 45 connects the mount plate 20 to the end portion 35. The mount 5 is adapted such that the screw 45 mates with the end portion 35. The mount 5 is adapted such that the screw 45 is adapted to rotate freely in the further hole 40 of the mount plate 20.

The mount 5 is adapted such that rotation of the screw 45 in a first direction, moves the end portion 35 towards the mount plate 20. The mount 5 is adapted such that movement of the end portion 35 towards the mount plate 20 causes a compressive force to be applied to the first connecting element 10 in a direction parallel to the axis X. The mount 5 is adapted such that movement of the end portion 35 towards the mount plate 20 causes compression of the first connecting element 10 between the mount plate 20 and the intermediate portion 70. One would appreciate that in other embodiments encompassing the inventive concept of the present invention, if there is no intermediate portion 70 then the mount 5 may be adapted such that movement of the end portion 35 towards the mount plate 20 causes compression of the first connecting element 10 between the mount plate 20 and the end portion 35.

The first connecting element 10 is adapted such that movement of the end portion 35 towards the mount plate 20 causes compression of the first connecting element 10 between the mount plate 20 and the intermediate portion 70. The screw 45 is adapted to be rotated by an Allen key, a screwdriver, or the like, wherein rotation in the first direction causes the end portion 35 to move towards the mount plate 20.

The first connecting element 10 is adapted such that compression of the first connecting element 10 in an axial direction cause expansion of the first connecting element 10 in a radial direction. The first connecting element 10 is adapted such that compression of the first connecting element 10 in a direction along the axis e.g. the longitudinal axis X of the mount 5, causes expansion of the first connecting element 10 in a direction radial to the axis X.

As such, the mount 5 may be retained in the hole in the support (not shown) by the first connecting element 10. In use, the mount 5 is located in the hole in the support (not shown) and the screw 45 rotated until the expansion of the first connecting element 10 in a direction radial to the axis X forms a seal with the support.

The end portion 35 comprises an electrical contact (not shown). The screw 45 provides electrical connectivity between the mount plate 20 and the electrical contact. The screw 45 comprises at least a portion of the sensor probe.

The end portion 35 comprises a sensor circuit (not shown). The electrical contact is electrically connected to, or forms part of, the sensor circuit.

Figure 2:
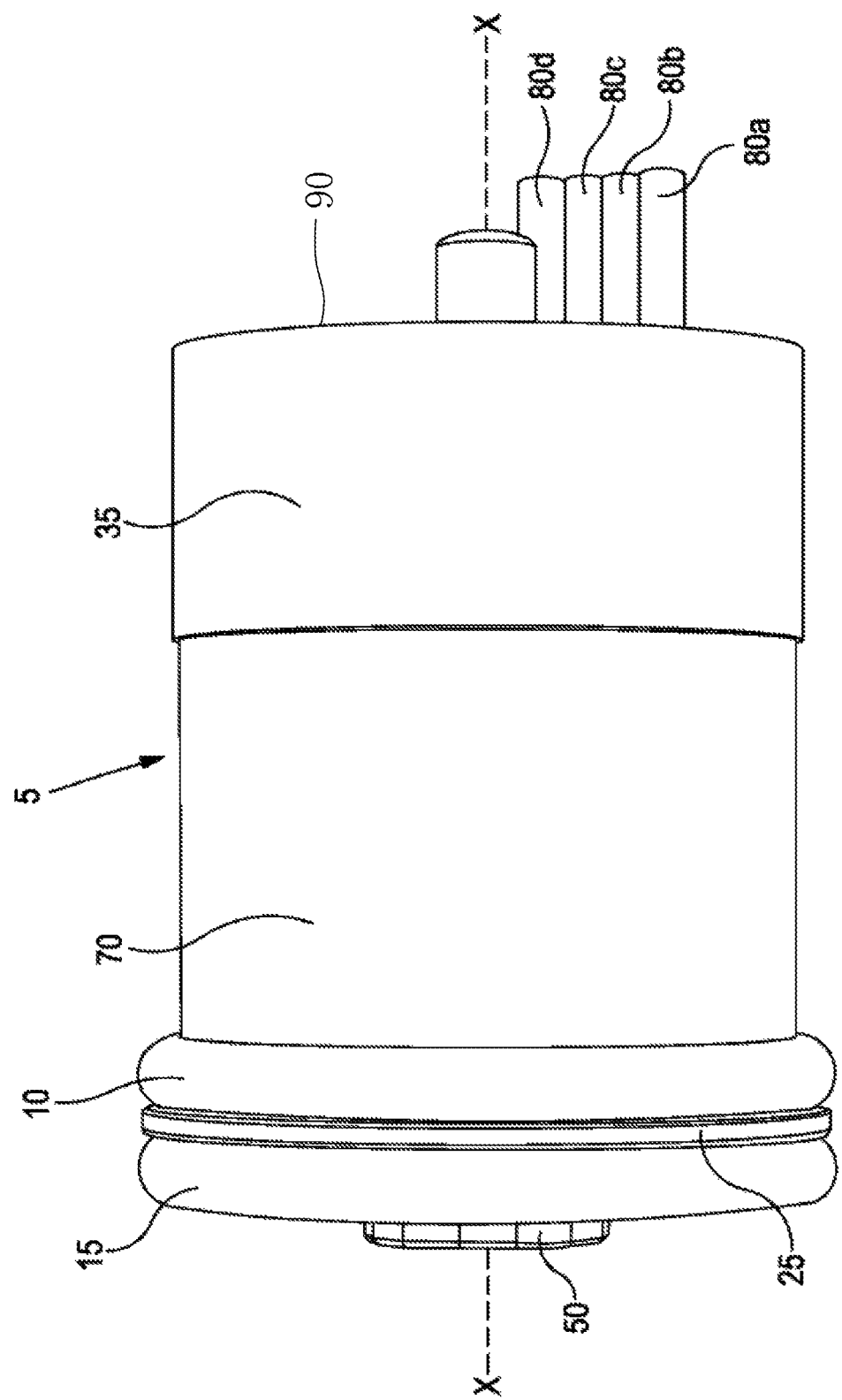
FIG. 2 a side view of the mount of FIG. 1b.

FIG. 2 shows a side view of the assembled mount 5 of FIG. 1b. A plurality of contacts 80a, 80b, 80c, 80d protrude from a rear face 90 of the end portion 35. The contacts correspond to supply lines VCC− and VCC+, to a control signal and to an LED control signal, as described in more detail with reference to FIG. 12. The plurality of contacts 80a, 80b, 80c, 80d are electrically connected to the sensor circuit (not shown) inside the mount 5.

FIG. 3 shows a front view of the assembled mount 5 of FIG. 1b. The raised portion 50 comprises a plurality of substantially flat edges 55a, 55b, 55c, 55d, 55e, 55f.

Figure 4:
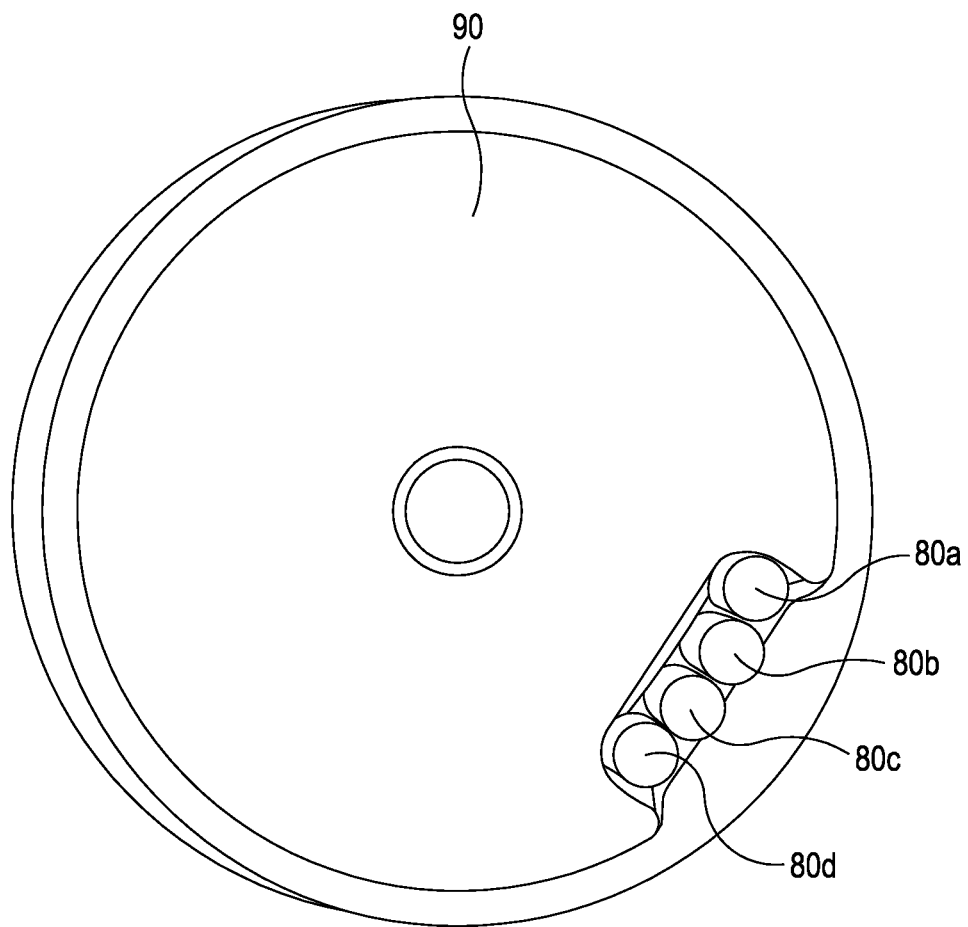
FIG. 4 a rear view of the mount of FIG. 1b.

FIG. 4 shows a rear view of the assembled mount 5 of FIG. 1b, more clearly showing the plurality of contacts 80a, 80b, 80c, 80d protruding from a rear face 90 of the end portion 35.

Figure 5A:
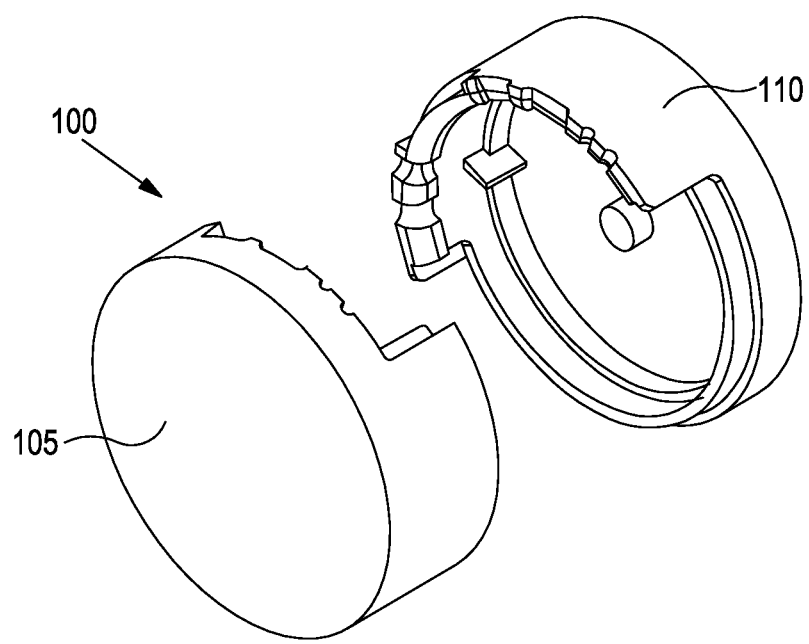
FIG. 5a an isometric, exploded view of a housing for a controller according to an embodiment of the invention.
Figure 5B:
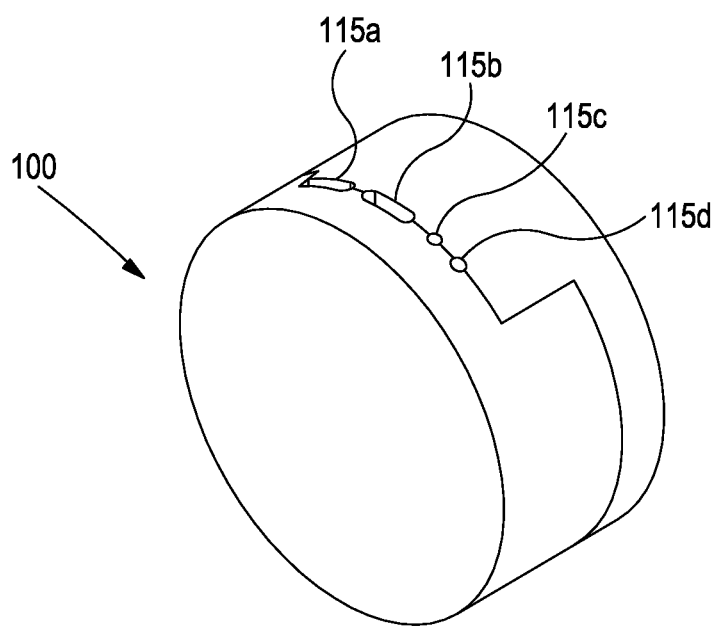
FIG. 5b an isometric view of the assembled housing of FIG. 5a in an "in use" configuration.
Figure 12:
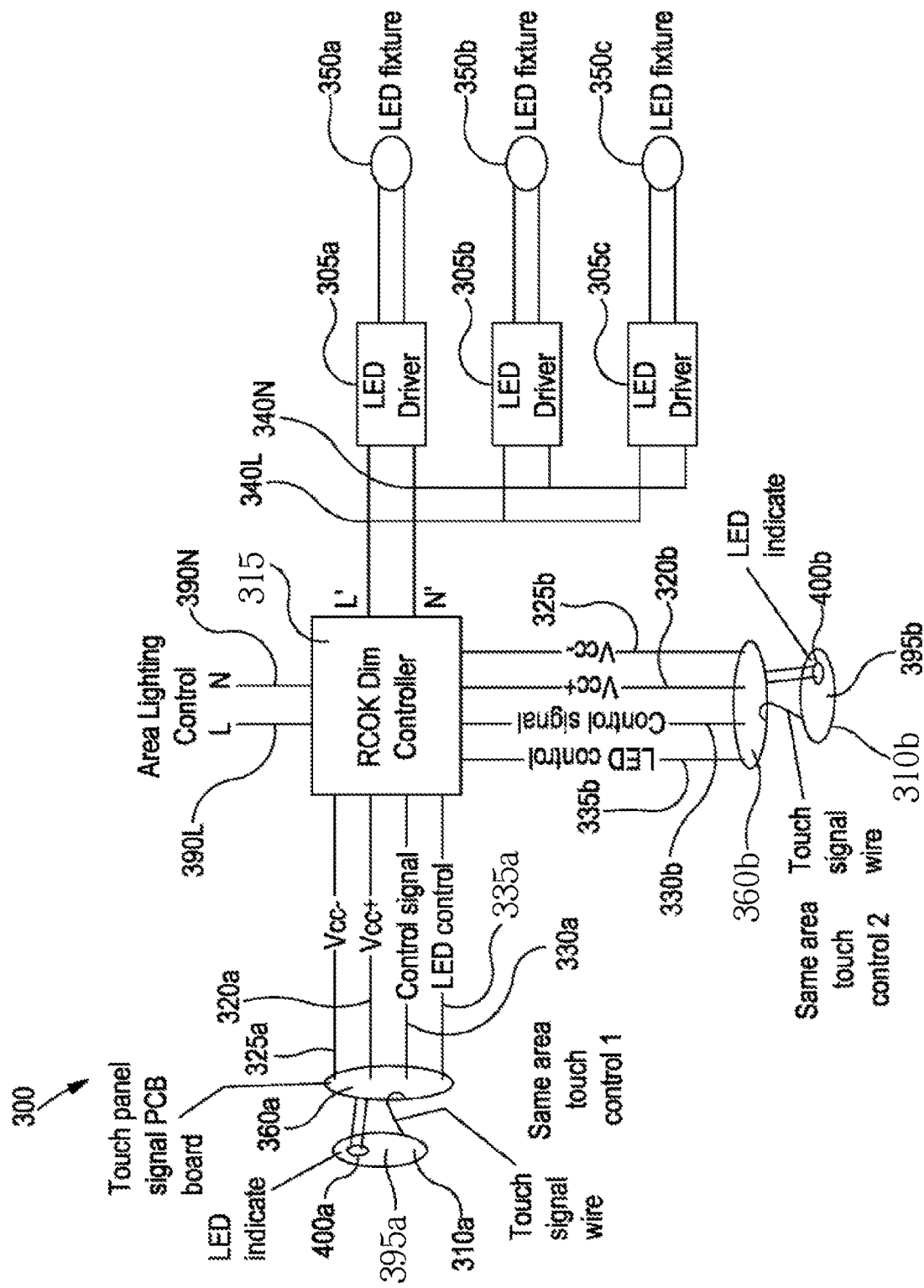
FIG. 12 a representation of a system for controlling three electrical devices according to an embodiment of the present invention.

FIG. 5a shows an oblique, exploded view of an exemplary housing for a controller, generally denoted 100 according to an embodiment of the invention. The housing 100 comprise an upper section 105 and a lower section 110. The housing 100 is adapted to house the controller 315 (FIG. 12). The assembled housing, as shown in FIG. 5b, comprises a plurality of outlets 115a, 115b, 115c, 115d. The outlets 115a, 115b, 115c, 115d are adapted to permit cables, wires or the like to extend from the controller to the sensor apparatus and/or the at least one electrical device and/or a power supply.

Figure 6A:
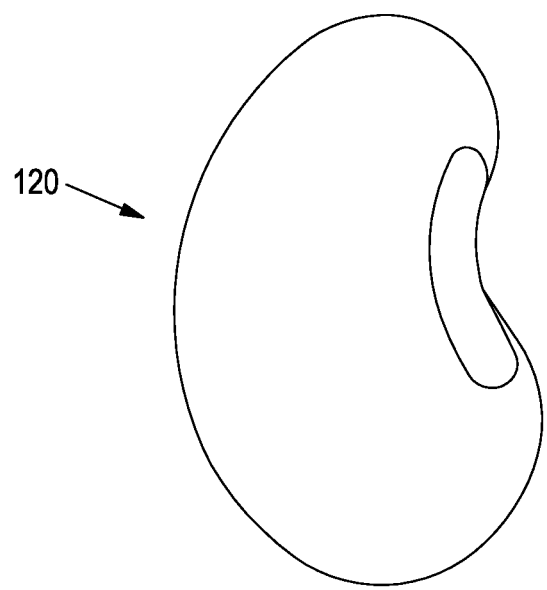
FIG. 6a an exemplary representation of a sensor element according to an embodiment of the present invention.
Figure 6B:
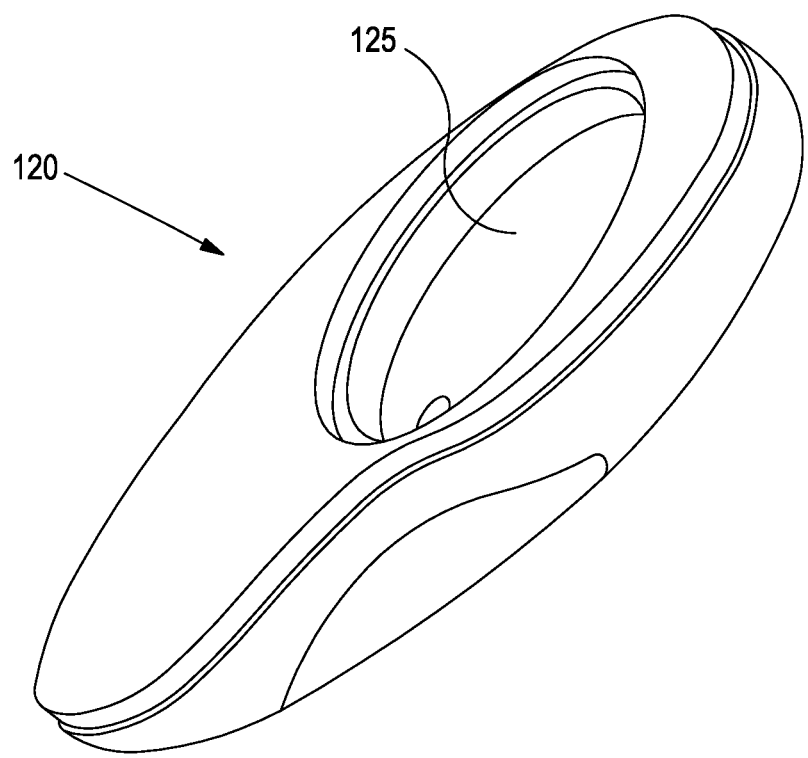

FIGS. 6a and 6b show representations of an exemplary sensor element, generally denoted 120, according to an embodiment of the present invention. In this embodiment, the sensor element or "touch plate" as a convex side and an opposite concave side and is substantially bean-shaped. One would appreciate that in other embodiments of the present invention, the sensor element 120 may be a different shape, size of colour from that shown in FIGS. 6a and 6b, and may be of may comprise portions being substantially square, circular, rectangular, triangular, oval-shaped, curved, concave, convex, or the like.

In the embodiment shown, the sensor element 120 comprises a conductive material. The sensor element 120 is a portion of a probe for a capacitive touch sensor, wherein the screw 45 is also a portion of the capacitive touch sensor.

The sensor element 120 comprises a substantially circular recess 125. The recess 125 is adapted to sealingly engage with the second connecting element 15. The sensor element 120 releasably connects to the mount 5 by a pressure fit connection with the second connecting element 15.

One would appreciate that in other embodiments of the present invention the sensor element 120 may be non-conductive, or at least have a non-conductive outer surface. In such a configuration, the mount plate 20 and screw 45 form the capacitive touch sensor probe and the sensor element 120 is sufficiently thin that the capacitive touch sensor probe is capable of detecting the proximity of a conductive object, i.e. a finger touching the sensor element.

In further embodiments that fall within the scope of the invention, the sensor element 120 may comprise a conductive portion, and/or, a surface of the sensor element 120 may be at least partially conductive. For example, the sensor element may comprise conductive veins and/or wires and/or elements embedded within and/or upon the sensor element 120.

Figure 7A:
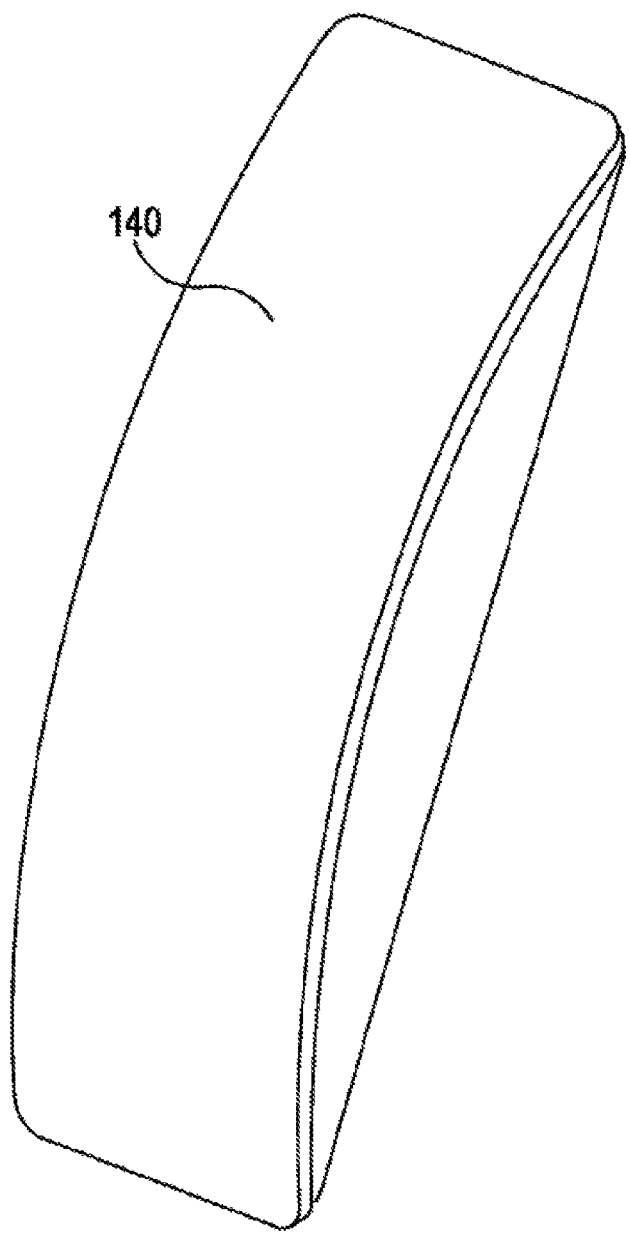
FIG. 7a an exemplary representation of a sensor element according to another embodiment of the present invention.
Figure 7B:
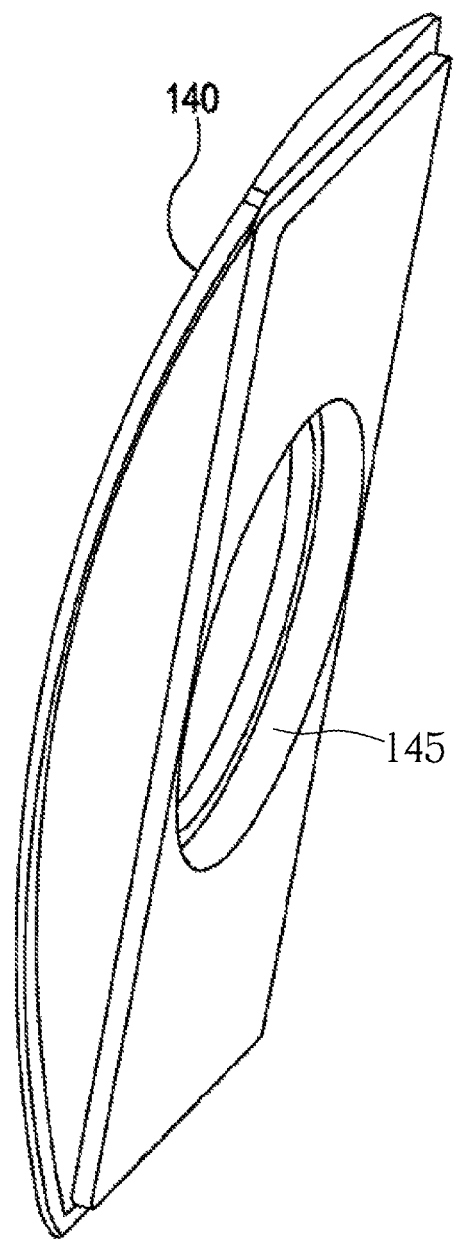

FIGS. 7a and 7b show another representation of an exemplary sensor element, generally denoted 140, according to an embodiment of the present invention.

In this embodiment, the sensor element has a curved contact surface defining substantially parallel edges. Similar to the embodiment of FIGS. 6a and 6b, the sensor element 140 comprises a substantially circular recess 145. The recess 145 is adapted to sealingly engage with the second connecting element 15. The sensor element 140 releasably connects to the mount 5 by a pressure fit connection with the second connecting element 15.

Figure 8:
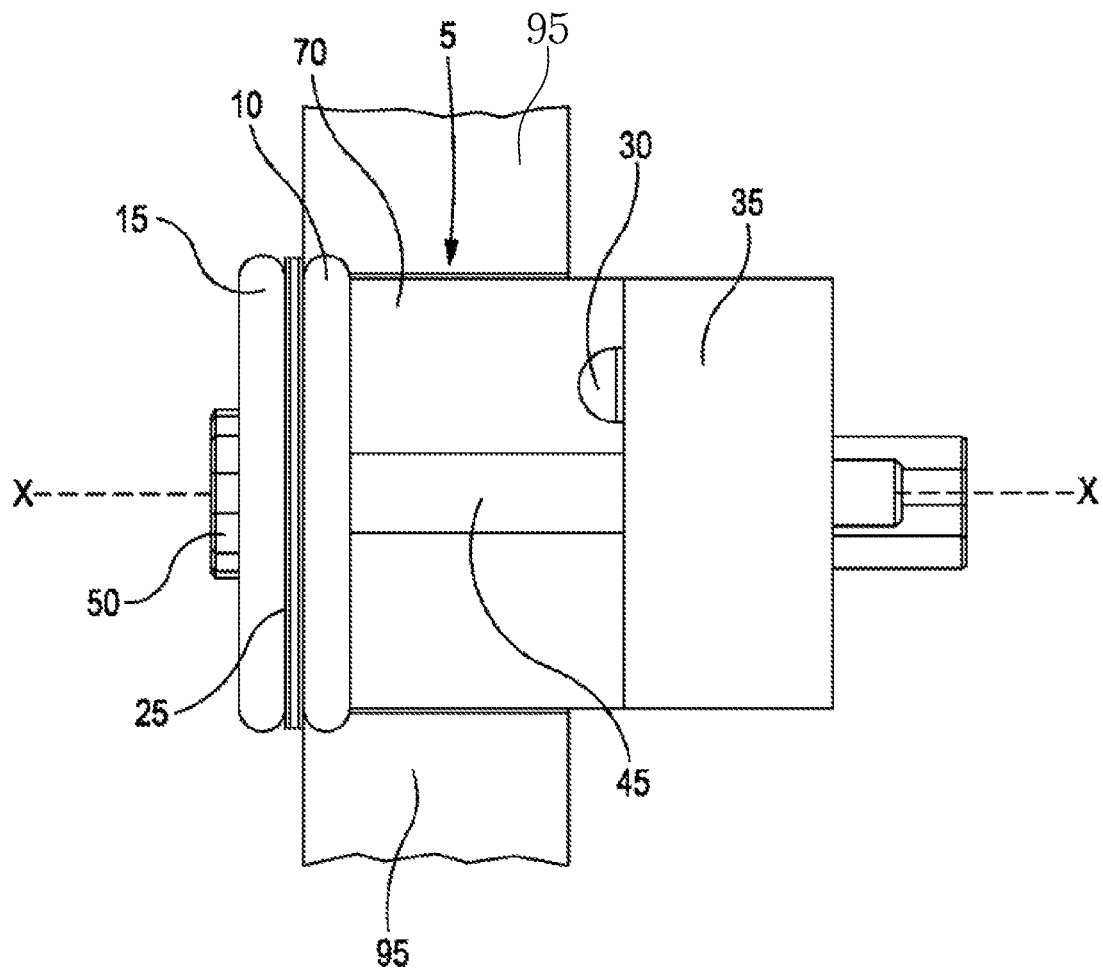
FIG. 8 a cross-sectional view of a wall, with the mount of FIG. 2 mounted in the wall.

FIG. 8 shows a cross-sectional view of a support 95, with the mount of FIG. 2 mounted in the support 95. The first connecting element 10 of the mount 5 is adapted to form a seal with the support 95. In the exemplary embodiment of FIG. 8, the support 95 is a portion of a wall.

Figure 9:
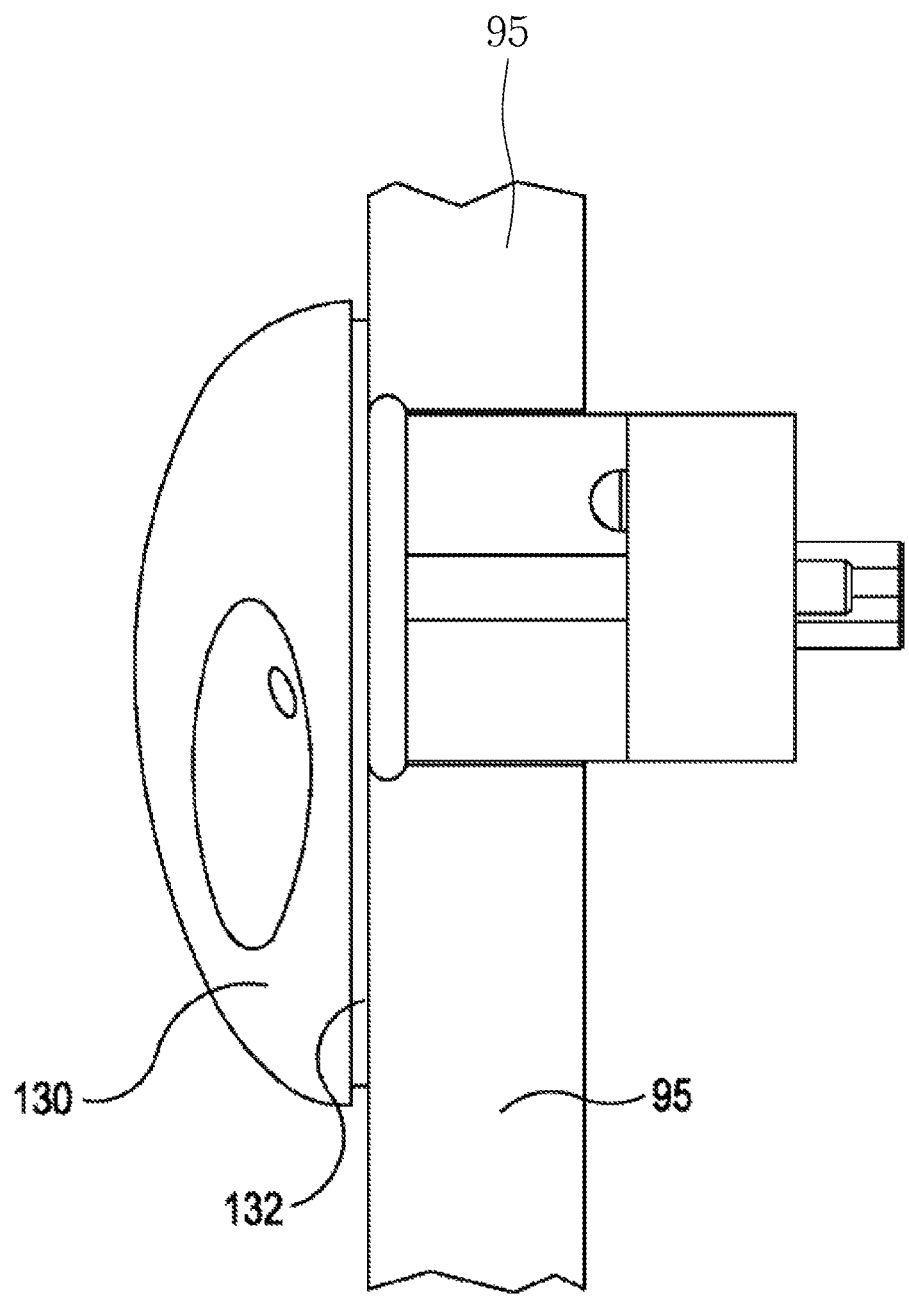
FIG. 9 the mount of FIG. 8 with a sensor element attached.

FIG. 9 shows the mount of FIG. 8 with a sensor element 130 attached. As can be seen more clearly in FIG. 10, which shows the apparatus of FIG. 9 with a cross sectional view of the sensor element 130, the second connecting element 15 is adapted to sealingly engage with the sensor element 130.

Figure 10:
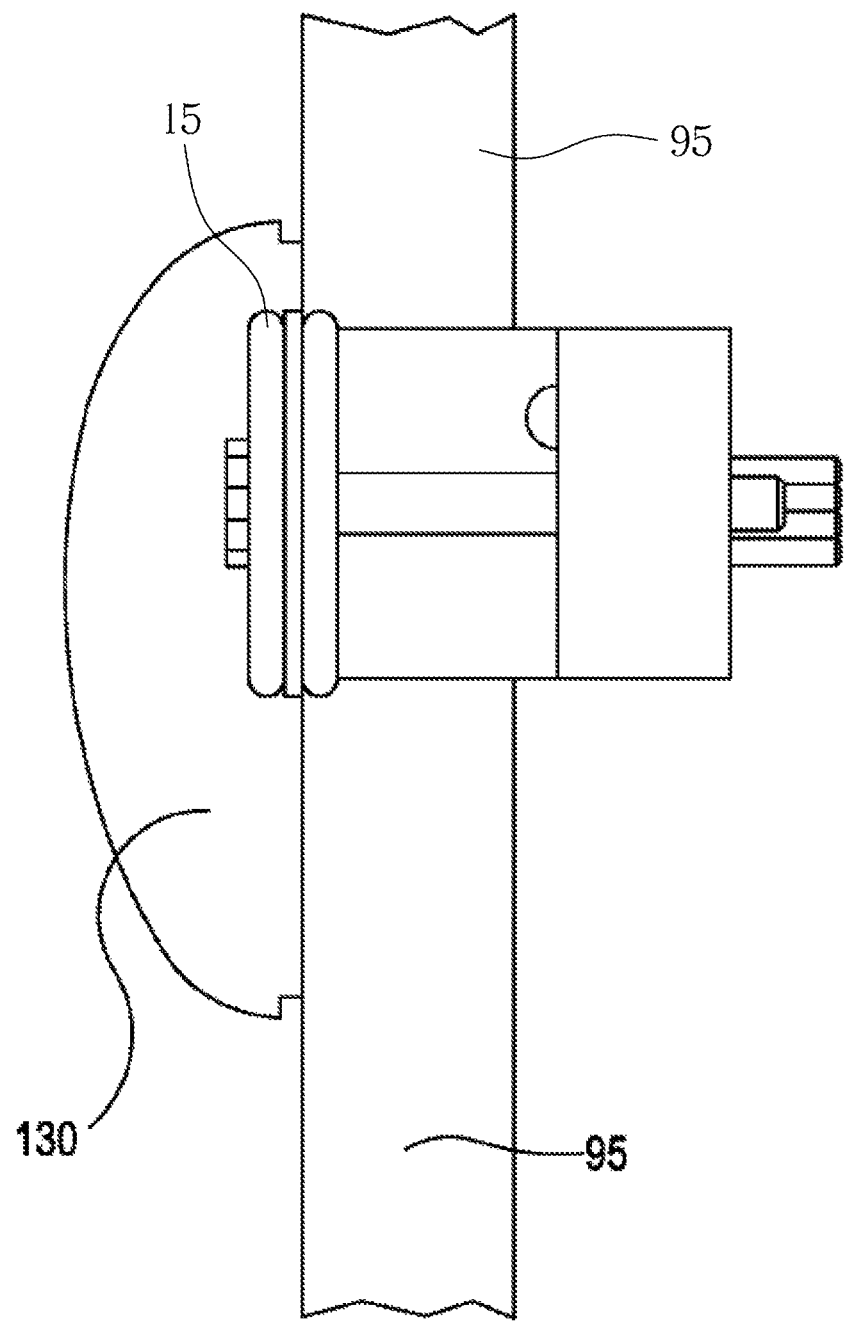
FIG. 10 the apparatus of FIG. 9, with a cross sectional view of the sensor.

In the exemplary embodiment of FIGS. 8, 9 and 10, the intermediate portion 70 is shown as translucent, such that the intermediate portion 70 is adapted to diffuse and/or propagate light from the indicator device 30 towards to the sensor element 130. The sensor element 130 comprises a base section 132, wherein light from the indicator device 30 may be diffused through the base section 132. Such an arrangement may advantageously result in a perceived glow around the sensor element 130, which may be used to indicate a mode of operation or status of the apparatus.

Figure 11:
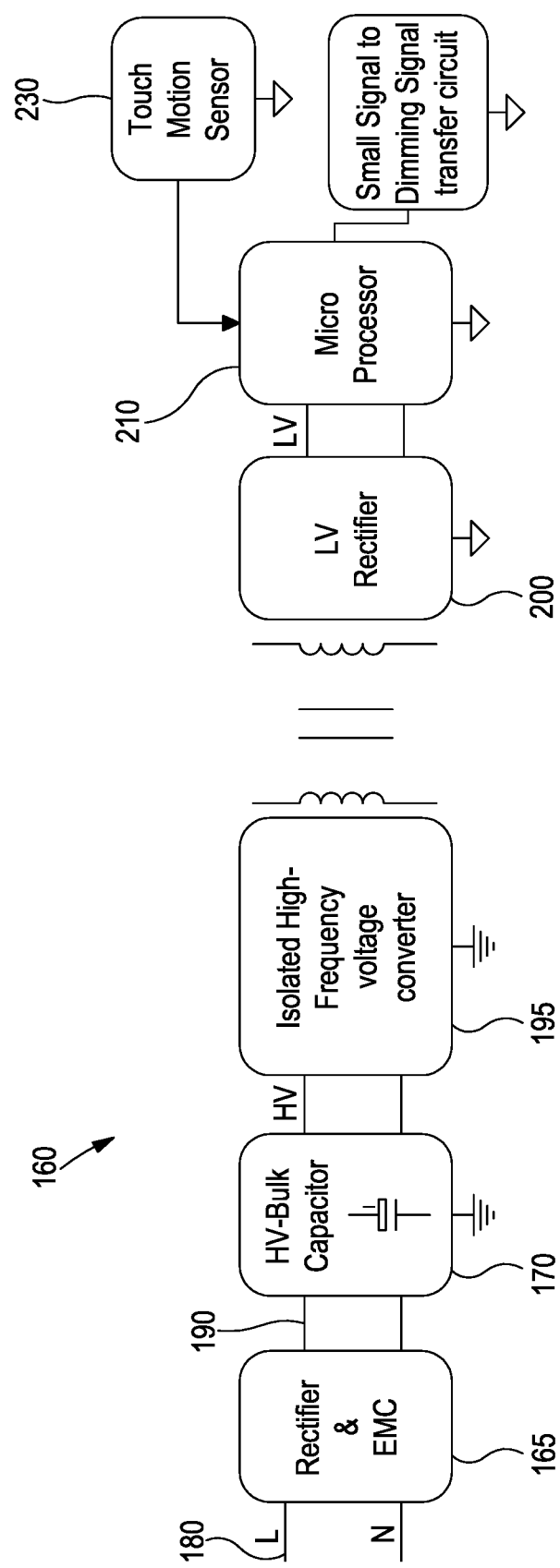
FIG. 11 a representation of a controller for controlling at least one electrical device according to an embodiment of the present invention.

FIG. 11 shows a representation of a controller, generally denoted 160 for controlling at least one electrical device according to an embodiment of the present invention. The controller 160 is adapted to receive the high voltage power supply. In the exemplary embodiment shown, such a high voltage power supply is represented as an AC power supply 180, shown by Live and Neutral power supply lines denoted L and N. The AC power supply is rectified by rectifier 165. Rectifier 165 also comprises components and/or shielding to enhance electromagnetic compatibility of the supply. The resultant DC power supply comprises a bulk capacitor 170 to compensate for any fluctuations or dips in the high voltage power supply 190. The high frequency voltage converter 195 performs DC to DC conversion, to step the supply down to a low voltage in a range suitable for use by a low voltage microprocessor based system. A low voltage rectifier 200 provides a stable low voltage supply to the microprocessor 210. The microprocessor 210 of the controller 160 is adapted to communicate with at least one electrical device. The controller 160 is adapted to communicate with and/or receive a signal from at least one sensor apparatus 230. The controller 160 is adapted to configure, adapt and/or communicate with at least one electrical device based on a signal received from at least one sensor apparatus 230.

An exemplary specification for a controller 160 is provided in Table 1 below. One would appreciate that in other embodiments of the present invention, individual components of the specification may differ from those shown in the exemplary embodiment described in Table 1.

TABLE 1

| 0/10 V Dimming Control Box Electronic | | | | | |
|---|---|---|---|---|---|
| Parameter | Conditions | min. | Typ. | Max. | Unit |
| Input Votage Range | | 198 | 220-240 | 264 | Vac |
| Input Frequency | | 50 | | 60 | Hz |
| Output Source Current | Dim+/Gnd | | | 0.6 | mA |
| Output Sink Current | Dim+/Gnd | | | 100 | mA |
| Pout | | | | 0.5 | W |
| Surge Withstand | L-N | | 1 | | kV |
| Dim Open voltage | No Load | 10 | | 10.5 | Vdc |
| Ta | | −20 | | 40 | ° C. |
| Pin.max | | | | 1 | W |
| Start-Up Delay | @230 Vac | | 0.5 | 1 | s |
| Load Life | @Ta Max. | | 50000 | | hr |
| Protection | Dim Shortage | | Auto Recovery | | |
| PCB Dimension | Diameter*Thickness | | 40*1 | 40.5*1.2 | mm |
| Features | 1. Connect max. 2 Touch Sensors(HTCAA00I) 2. Control Touch Sensor LED Light Off while Lamps on, instead, LED Light on while Lamps off 3. Receiving Touching Signal and control LED Drivers(Lamps) behaviors. 4. Dimming Source and Sink current is related to the limitation of Max, amount of drivers/not wattage related). | | | | |

FIG. 12 shows a representation of an exemplary system, generally denoted 300, for controlling three electrical devices 305a, 305b, 305c according to an embodiment of the present invention. The system 300 comprises two sensor apparatuses 310a, 310b, and a controller 315. The two sensor apparatuses 310a, 310b and three electrical devices 305a, 305b, 305c are electrically connected to the controller 315. One would appreciate that in other embodiments of the present invention, there may be more electrical devices, such as four, five or more, or fewer electrical devices such as one or two. One would also appreciate that there may be only a single sensor apparatus, or there may be three of more sensor apparatuses.

Each apparatus 310a, 310b is adapted to receive a low voltage supply 320a, 320b, 325a, 325b, denoted VCC+, VCC−. Each apparatus 310a, 310b is adapted to provide a control signal 330a, 330b to the controller 315. Each apparatus 310a, 310b is adapted to receive and/or transmit an LED control signal 335a, 335b to/from the controller 515.

Each electrical device 305a, 305b, 305c is adapted to receive a high voltage supply 340N, 340L.

Each electrical device 305a, 305b, 305c comprises at least one LED light source 350a, 350b, 350c. In other embodiments, each electrical device may comprise a motor.

Each electrical device 305a, 305b, 305c comprises driver circuitry, wherein the driver circuitry comprises a TRIAC LED driver.

Each electrical device 305a, 305b, 305c is adapted to be supplied by a high voltage power supply 340N, 340L relative to a voltage of a power supply 320, 325 to the sensor circuit 360a, 360b. In an exemplary embodiment, each TRIAC LED driver may have a frequency of substantially in the range of 50 to 60 Hz and a voltage substantially in the range of 100 to 120V or 220 to 240V.

Each electrical device 305a, 305b, 305c is adapted to be actuated, e.g. switched on, switched off and/or dimmed, by the controller 315.

The controller 315 is adapted to receive a high voltage power supply 390L, 390N. The controller provides, and controls, the high voltage power supply 340L, 340N to the electrical devices 305a, 305b, 305c. The controller 315 is adapted to provide a low voltage 320, 325 to the sensor circuit 360a, 360b.

Each sensor circuit 360a, 360b comprises at least one touch sense controller or the like. The sensor circuit 360a, 360b is adapted to detect and/or measure relative changes and/or durations of electro-static charges, such as electro-static charges present at a sensor element 395a, 395b.

Each sensor circuit 360a, 360b comprises an indicator device 400a, 400b. The indicator devices 400a, 400b comprise an LED. The at least one indicator device may provide an indication, i.e. illuminate or dim the LED, when a relative change in electro-static charge is detected and/or for the duration of that change.

The sensor circuit operates at a low voltage 320a, 325a, 320b, 325b relative to a voltage of the electrical devices 340L, 340N. Tithe sensor circuit operates at a DC voltage. The DC voltage may be around 5V, 3.3V, 1.8V, or the like.

An exemplary specification for a sensor circuit 360a, 360b is provided in table 2 below. One would appreciate that in other embodiments of the present invention, individual components of the specification may different from those shown in the exemplary embodiment described in Table 2.

TABLE 2

Customized Touch Sensor Electronic

| Parameter | Conditions | min. | Typ. | Max. | Unit |
|---|---|---|---|---|---|
| Input Votage Range | | 4.5 | 5 | 5.5 | Vdc |
| Working Current | LED off | | | 0.1 | mA |
| | LED on | | 10 | 20 | mA |
| Wiring Distance | | | | 10 | cm |
| Ta | | −20 | | 40 | ° C. |
| Pin.max | | | | 1 | W |
| Start-Up Delay | @5 Vdc | | 0.1 | 0.2 | s |
| Load Life | @Ta Max. | 50000 | 60000 | | hr |
| PCB Dimension | Diameter*Thickness | | 16*2 | 16.5*2.1 | mm |
| Features | 1. Transmit touch signal to control box(HDCIE001S010VA) 2. Avoid Wiring doser to High Voltage 3. The sensitive is accoring to the shape of the metal. Keep the touch pad from high voltage. | | | | |

Figure 13:
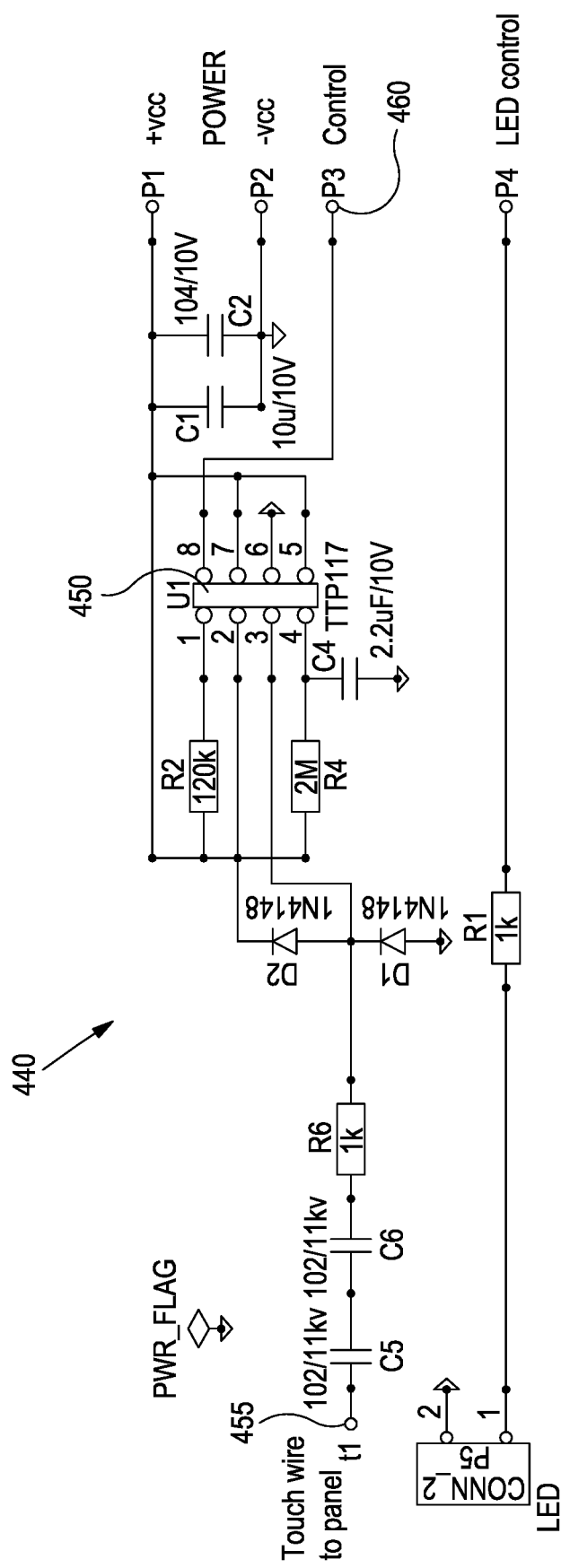
FIG. 13 a representation of a sensor circuit according to an embodiment of the present invention.

FIG. 13 shows a representation of a sensor circuit, generally denoted 440, according to an embodiment of the present invention. The sensor circuit comprises a Touch Detector Integrated Circuit 450. The circuit node 455 is connected to the sensor probe 45. Circuit node 460 is an output control signal to the controller 315. One would appreciate that, while in exemplary embodiments of the present invention output control signal may be a pulse width modulated signal, in other embodiments encompassing the inventive concept of the present invention, the output control signal may adhere to any appropriate communications protocol.

It will be appreciated that the embodiments of the invention here before described are given by way of example only and are not meant to limit the scope of thereof in any way.

The invention claimed is:

1. A sensor apparatus, the sensor apparatus comprising:
a mount adapted to be attached to a support, wherein the mount is adapted to be located within a hole, gap or void in the support, such that the support surrounds the mount; and
a sensor element adapted to be detachably connected to the mount.

2. The sensor apparatus of claim 1, wherein the mount, or a body of the mount, is substantially cylindrical.

3. The sensor apparatus of claim 1, wherein the mount comprises a first connecting element and a second connecting element, wherein each of the first and second connecting elements comprises a compressible and expandable body.

4. The sensor apparatus of claim 3, wherein the first connecting element is adapted to form a seal with the support, wherein the second connecting element is adapted to sealingly engage with or sealingly contact the sensor element, wherein the first connecting element is a flexible, elastic or elastomeric material, wherein the second connecting element is a flexible, elastic or elastomeric material.

5. The sensor apparatus of claim 3, wherein the mount comprises a mount plate.

6. The sensor apparatus of claim 5, wherein the mount plate is substantially disc-shaped or wheel-shaped, and wherein the mount plate comprises a circumferentially arranged flange or shoulder, wherein the first and second connecting elements are arranged on or abutting or the flange or shoulder, and wherein the first and second connecting elements are affixed to the mount plate by a push fit, or pressure fit connection, wherein the mount plate comprises a hole located substantially in a centre of the mount plate and the front face of the mount plate comprises a raised portion arranged around the hole, wherein the raised portion is arranged or configured to be gripped or retained by a tool.

7. The sensor apparatus of claim 5, wherein the mount comprises an end portion at, or near a location distal or opposite from a portion of the mount adapted for receiving or connection with the sensor element, wherein the end portion is adapted to receive a connecting element.

8. The sensor apparatus of claim 7, wherein the mount comprises the connecting element adapted to connect to the end portion, wherein the connecting element comprises a conductive material, and the mount is adapted such that the connecting element, connects the mount plate to the end portion, wherein the mount comprises at least one intermediate portion being translucent, such that the at least one intermediate portion is adapted to diffuse or propagate light towards to the sensor element, wherein the mount is adapted such that rotation of the connecting element in a first direction, moves the end portion towards the mount plate and wherein the first connecting element is adapted such that movement of the end portion towards the mount plate causes compression of the first element between the mount plate and the end portion or the at least one intermediate portion, wherein the first connecting element is adapted such that compression of the first connecting element in an axial direction causes expansion of the first connecting element in a radial direction.

9. The sensor apparatus of claim 7, wherein the end portion comprises an electrical contact, and the connecting element provides electrical connectivity between the mount plate and the electrical contact, wherein the end portion comprises a sensor circuit, wherein the electrical contact is electrically connected to, of forms part of, the sensor circuit, and the sensor circuit is adapted for capacitive touch sensing.

10. The sensor apparatus of claim 9, wherein the sensor circuit is adapted to communicate with at least one controller, wherein the at least one controller is adapted to communicate with at least one electrical device, wherein the sensor circuit is adapted to directly, or indirectly, communicate with the at least one electrical device, wherein the sensor circuit operate at a low voltage relative to a voltage of the at least one electrical device.

11. The sensor apparatus of claim 3, wherein the sensor element comprises a sensor probe for a capacitive touch sensor, wherein the sensor element comprises a substantially circular or cylindrical recess, the recess adapted to sealingly engage with the second connecting element by a push fit, or pressure fit connection.

12. A system for controlling at least one electrical device, the system comprising:
  at least one sensor apparatus according to claim 1;
  at least one electrical device; and
  a controller;
  wherein the at least one sensor apparatus and the at least one electrical device are electrically connected to the controller.

13. The system according to claim 12, wherein the at least one sensor apparatus is adapted to receive a low voltage supply and the at least one electrical device is adapted to receive a high voltage supply, wherein the at least one electrical device comprises at least one light source, wherein the at least one electrical device is adapted to be actuated by the controller.

14. The system according to claim 13, wherein the controller stores information relating to the at least one sensor apparatus in a memory, wherein the information relating to the at least one sensor apparatus comprises at least one of:
  historical information relating to previous usage or settings of the at least one sensor apparatus or the at least one light source;
  current information relating to previous usage or settings of the at least one sensor apparatus or the at least one light source;
  calibration data relating to relating to previous usage or settings of the at least one sensor apparatus or the at least one light source;
  wherein the controller is adapted to use the information relating to the at least one sensor apparatus to determine what to communicate with the at least one electrical device based on a signal received from the at least one sensor apparatus.

15. The system according to claim 13, wherein the controller is adapted to control dimming of the at least one light source based on signals received from any one or more of a plurality of sensor apparatuses, wherein in use, the controller is located in the proximity of one of the at least one sensor apparatuses, the controller is located in the proximity of one of the at least one electrical devices.

16. The system according to claim 12, wherein the controller provides, or controls, a high voltage power supply to the at least one electrical device and wherein the controller is adapted to provide a low voltage to a sensor circuit, wherein the controller is adapted to communicate with the at least one electrical device and to communicate with or receive a signal from the at least one sensor apparatus, wherein the controller is adapted to communicate with the at least one electrical device based on the signal received from the at least one sensor apparatus.

17. A method of installing a sensor apparatus, wherein the method comprises:
  providing a sensor apparatus, wherein the sensor apparatus comprises a mount and a sensor element, the mount is adapted to be attached to a support, and the mount is adapted to be located within a hole, gap or void in the support, the sensor element is adapted to be detachably connected to the mount;
  retainably affixing the mount within the support, such that the support surrounds the mount; and
  detachably connecting the sensor element to the mount.

18. The method of claim 17, wherein the method comprises the step of:
  locating the mount within the hole in the support;
  rotating a connecting element in the mount until a radial expansion of a first connecting element forms a seal with the support;
  gripping or restraining a mount plate during rotation of the connecting element in the mount, such that the connecting element rotates relative to the mount plate; and
  releasably connecting the sensor element to the mount comprises applying a pushing force to the sensor element, the force acting to push the sensor element against the mount.

19. A method of use of a system for controlling at least one electrical device, wherein the method comprises:
  providing a system, wherein the system comprises at least one sensor apparatus, the at least one electrical device and a controller, the sensor apparatus comprises a mount and a sensor element, the mount is adapted to be attached to a support, the mount is adapted to be located within a hole, gap or void in the support, such that the support surrounds the mount, the sensor element is adapted to be detachably connected to the mount, the at least one sensor apparatus and the at least one electrical device are electrically connected to the controller;
  touching a sensor element to actuate the at least one electrical device;
  wherein actuation of the at least one electrical device comprises:

switching on or switching off the at least one electrical device;

adjusting or configuring, e.g. adjusting a power supply to, the at least one electrical device.

20. The method of claim 19, wherein the method further comprises the step of:

touching the sensor element for a first duration, wherein a first duration of touching the sensor element is in the region of 1 second; and touching the sensor element for a second duration, wherein a second duration of touching the sensor element is in the region of 1 second;

wherein touching the sensor element for a first or second duration actuates the at least one electrical device, wherein a degree of actuation of the at least one electrical device is related.

* * * * *